United States Patent [19]

Cheze

[11] 4,015,223
[45] Mar. 29, 1977

[54] HF ANTENNA MATCHING DEVICE
[75] Inventor: René Chezé, Paris, France
[73] Assignee: Thomson-CSF, Paris, France
[22] Filed: Jan. 21, 1976
[21] Appl. No.: 650,855
[30] Foreign Application Priority Data
Jan. 22, 1975 France .............................. 75.01969
[52] U.S. Cl. ............................. 333/17 M; 333/10; 333/32
[51] Int. Cl.² ........................................ H03H 7/40
[58] Field of Search ..................... 325/171–177; 333/10, 17 M, 32, 33

[56] References Cited
UNITED STATES PATENTS

| 3,601,717 | 8/1971 | Kuecken | 333/17 M |
| 3,794,941 | 2/1974 | Templin | 333/17 M |
| 3,959,746 | 5/1976 | Straw | 333/17 M |

Primary Examiner—Paul L. Gensler
Attorney, Agent, or Firm—Cushman, Darby & Cushman

[57] ABSTRACT

An antenna matching device comprises a directional coupler and, respectively connected, in a prior art manner, to two conjugate ports of the directional coupler, one of which is a high-power port, and the other of which a low-power port, a matching circuit in series with the antenna to be matched, and a matched load. A switching device makes it possible, during the matching phase, to reverse the connections of the aforementioned ports and thus to substitute the directional coupler low-power path for the high-power path in the link between the transmitter and the antenna.

3 Claims, 3 Drawing Figures

HF ANTENNA MATCHING DEVICE

The present invention relates to a H.F. antenna matching device which makes it possible to very substantially reduce radiation from the antenna during the matching phase.

Throughout this description as well as in the claims, the concept of pairs of conjugate ports has been used in relation to $n$ dB directional couplers; the term pair of conjugate ports of the coupler is intended to signify two of the four parts of the coupler such that, if matched loads are connected there, there is virtually no coupling between the other two ports of the coupler; the other two ports also constitute pairs of conjugate ports.

Both in the prior art matching devices as well as in those in accordance with the present invention, the $n$ dB directional couplers are couplers in which $n$ is very much greater than 3; thus, considering one port of the first pair of conjugate ports of a coupler, to which an input signal is to be applied, and assuming that the two ports of the second pair of conjugate ports of said coupler are terminated in matched loads, it is possible to respectively designate the two ports of the second pair the high-power port and the low-power port depending upon whether they are receiving virtually the whole of the input signal or only a fraction thereof.

The conventional antenna matching devices using directional couplers having a matching circuit which is permanently connected to the high-power port of the coupler; in the matching phase, the antenna transmits due to the high-frequency energy supplied to it from the transmitter, via the coupler. The signals appearing at the low-power port and at the port conjugate with the one to which the transmitter is connected, are respectively proportional to the direct antenna wave and the wave reflected by the antenna; they are used to adjust the reactances of the matching circuit.

This method of control entails risks of a premature detection of a transmitter coupled to the antenna, or of a detection of a receiver coupled to the antenna since, in the case of a receiver, control can only readily be performed by a method which involves the supply of energy to the antenna.

The object of the present invention is to overcome these risks of a detection being established, while retaining the same precision in the control of the matching circuit as is obtainable by the conventional method.

In accordance with the invention, there is provided a HF antenna matching device comprising: a directional coupler having first and second pairs of conjugate ports in which one port of the first pair of conjugate ports, which will be referred to as the first port, is designed to receive a control signal in the matching phase, said first port having a given coupling coefficient vis-a-vis one of the ports, which will be referred to as the high-power port, of the second pair of conjugate ports, and a lower coupling coefficient with the other port, which will be referred to as the low-power port, of said second pair; a matching circuit and a matched load, respectively coupled to the two ports of said second pair; and a switching device for either coupling the matching circuit to the high-power port and the matched load to the low-power port or vice versa.

The invention will be better understood and other characteristics will appear from a consideration of the following description and the related drawing in which.

Figure 1:
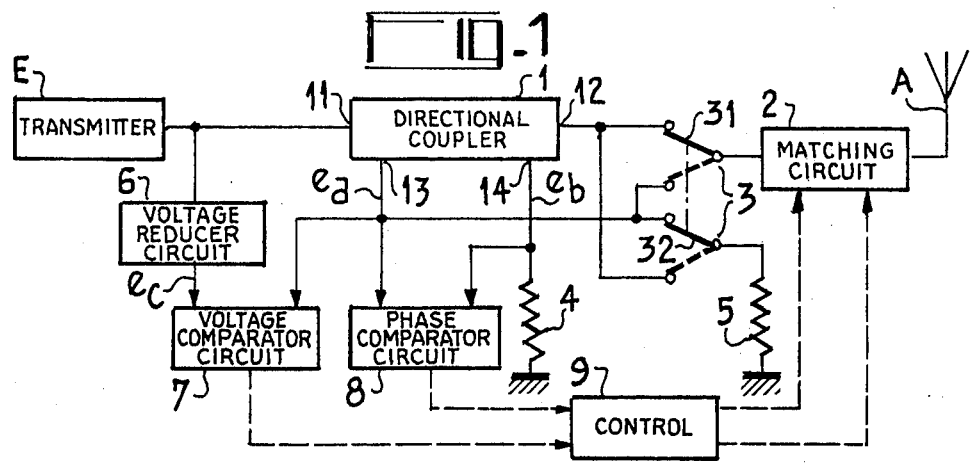
FIG. 1 is a general diagram illustrating a transmitter and an antenna connected by a matching device in accordance with the invention.

In FIG. 1, a transmitter E is shown connected to an antenna A by a matching device comprising: a matching circuit 2 to which there is connected the antenna A, a directional coupler 1, a double switch 3, matched loads 4 and 5 and elements 6 to 8 designed to make it possible to adjust the matching circuit 2. In the matching phase, the transmitter, in the conventional way, delivers a pure sinusoidal wave.

The directional coupler 1 is an $n$ dB coupler, where $n$, as in conventional matching devices with couplers, is at least equal to 20 in order to reduce to the maximum possible extent the power losses due to the insertion of the coupler. The two pairs of conjugate ports of the coupler 1 respectively carry references 11, 14 and 12, 13.

The transmitter E is connected to the port 11 of the coupler and a matched load, 4, of impedance $Z_o$, one end of which is grounded, is connected by its other end to the port 14.

The double switch 3 comprises two moving contacts 31, 32 which are mechanically coupled and can occupy two positions, one of which is shown in full line and the other in broken line. In the transmission phase, that is to say when the power delivered by the transmitter is intended to be radiated by the antenna, the high-power port 12 of the coupler 1 is connected to the matching circuit 2 while the low-power port 13 is connected to one of the ends of the matched load 5 (full-line illustration of the switch 3); the other end of the matched load 5 is grounded. This kind of arrangement is used both during the transmission phase and during the matching phase in conventional matching devices which employ directional couplers. With this kind of arrangement, when the transmitter is producing power, voltages appear at the ports 13 and 14 of the directional coupler, which voltages are a function respectively of the power supplied to the antenna and the power reflected by it.

During the matching phase, this kind of arrangement has the drawback, as already indicated, that the transmitter may be detected even before the start of transmission proper, since the antenna has to radiate the major part of the power supplied by the transmitter although only a small part of this power, namely that appearing at the ports 13 and 14, is actually used to adjust the matching circuit 2.

The switch 3, in a position shown in broken line, makes it possible during the matching phase, to reverse the connections to the coupler 1 linking the assembly constituted by matching circuit and antenna, and the matched load 5 which is normally connected to the port 13 of the coupler; self-evidently, this requires that the matched load 5 has an appropriate power dissipation.

To control matching, the circuit of FIG. 1 comprises the three elements 6 to 8.

The element 6 is a voltage reducer circuit coupled for receiving the high-frequency voltage supplied by the transmitter E; the reduction ratio has a fixed value such that if the assembly of matching circuit and antenna is replaced by a matched load, there appears at the output of the voltage reducer circuit a voltage whose amplitude is equal to that appearing at the port 13 of the directional coupler 1.

The element 7 is a voltage comparator circuit which is supplied at one of its two inputs with the output signal from the voltage reducer circuit 6 and at its other input with the signal appearing at the port 13 of the coupler; for brevity's sake, these signals will be respectively referred to as the signal $e_c$ and the signal $e_a$ whilst the signal appearing at the port 14 of the directional coupler will be referred to as the signal $e_b$.

The element 8 is a phase comparator circuit which is supplied at one of its two inputs with the signal $e_a$ and at its other with the signal $e_b$.

The voltage comparator circuit 7 and phase comparator circuit 8 include measuring instruments with a centre zero, the needle of which, in the case of the circuit 7, deflects as a function of the difference $|e_a| - |e_c|$ between the moduli of $e_a$ and $e_c$ and, in the case of the circuit 8, as a function of the phase difference between the signals $e_a$ and $e_b$.

An operator controls the matching circuit 2 in order to zero the needles of the instruments in the circuits 7 and 8. This has been symbolized by a block 9, labelled "control," having dotted inputs from blocks 7 and 8 and dotted outputs toward block 2.

The operator could be substituted by an automatic control circuit for the matching circuit 2; the information generated by the comparator circuits 7 and 8 would then be supplied in the form of electrical signals which would be used by the automatic control circuit, the latter being of the kind employed in conventional antenna matching devices.

Figure 2:
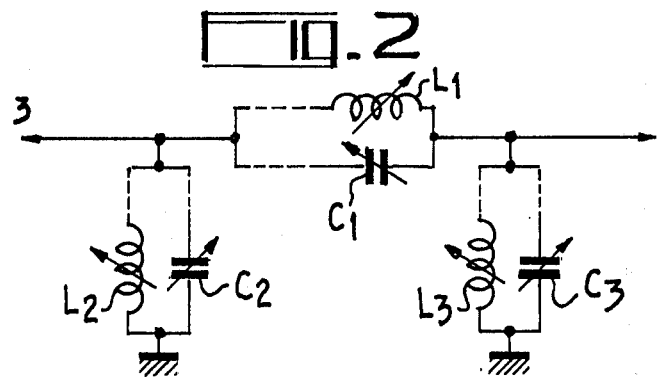
FIG. 2 is a more detailed diagram of one of the circuits of FIG. 1.

FIG. 2 is a simplified diagram of the matching circuit, 2, of FIG. 1. The matching circuit is formed by inductive and capacitive elements arranged in a $\pi$ network, each of the shunt arms of which is grounded and each arm comprising in parallel a variable inductor and a variable capacitor, namely $L_1$ and $C_1$ in the case of the series arm, $L_2$ and $C_2$ in the case of the shunt arm terminating at that terminal of the matching circuit which, in FIG. 1, is connected to the switch 3, and $L_3$ and $C_3$ for the other shunt arm.

A system of switches, symbolised by broken lines, makes it possible as a function of the impedance presented by the antenna at the transmitter operating frequency, to connect only one of the elements $L_1$, $C_1$ in series with the antenna A and one of the elements $L_2$, $C_2$, $L_3$, $C_3$ in parallel with the antenna A; adjustment is then carried out with the two elements connected until equal amplitudes and phases are obtained at the inputs of the voltage comparator circuit 7 and the phase comparator circuit 8.

Figure 3:
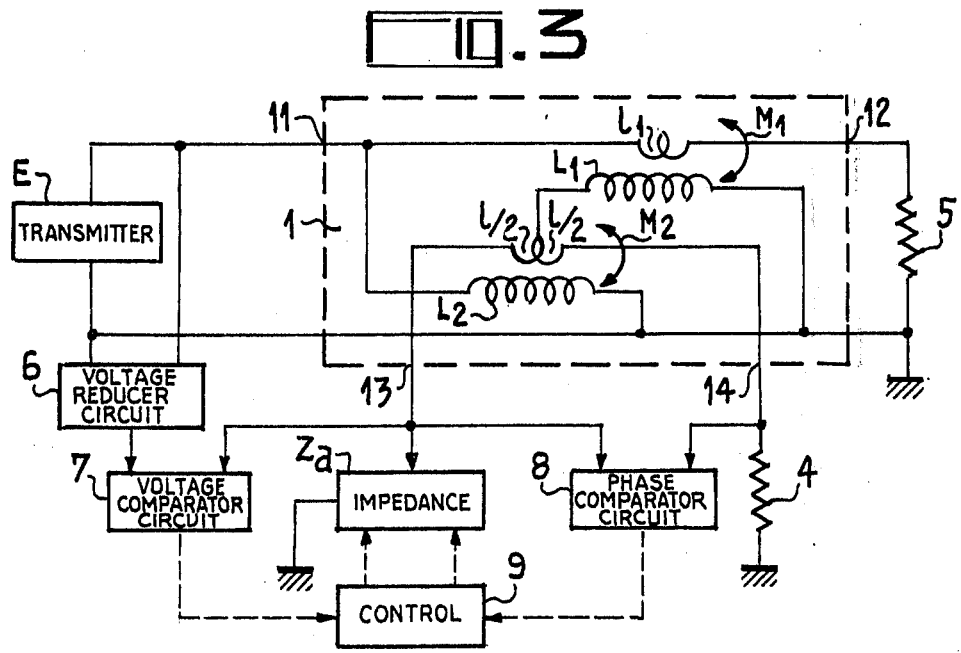
FIG. 3 is a partial diagram illustrating an embodiment of the matching device in accordance with the invention.

FIG. 3 shows, during the matching stage, a circuit corresponding to that shown in FIG. 1 and in which:
  the directional coupler 1 is shown in detail
  the matching circuit 2 and the antenna A are represented by an impedance $Z_a$ corresponding to the sum of their two impedances
  the ground connection of transmitter E has been shown
  switch 3 has not been given a reference and is indicated only by the connections that it makes during the matching stage.

The directional coupler 1 in FIG. 3 is of the magnetic coupling type. Between inputs 11 and 12 it comprises an inductance $l_1$ and, between the inputs 13 and 14, two half-inductances in series, each of the value $l/2$. Between ground and the common point of the two inductances of value $l/2$ the coupler 1 comprises an inductance $L_1$ connected with a coefficient of mutual inductance $M_1$ to inductance $l_1$. Between its input 11 and ground the coupler 1 also comprises an inductance $L_2$ connected to the inductance formed by the two half-inductances with a coefficient of mutual inductance $M_2$.

The directional coupler according to FIG. 3 is such that $L_1 = L_2$, $M_1 = M_2$
  $l_1 \omega$ and $l \omega/2$ very much less than $Z_o$,
  (where $Z_o$ is the value of the matched loads 4 and 5 and $\omega$ is the pulsation corresponding to the working frequency),
  $L_1\omega$ very much greater than $Z_o$.

Under these conditions, if V is the voltage delivered by the transmitter E and y the reflection coefficient of the impedance $Z_a$ in relation to the impedance $Z_o$, that is to say $$y = (Z_a - Z_o)/(Z_a + Z_o),$$

measurement and calculation shown that:

$$e_a = V(a\, M_1/L_1)(1 + y)$$

$$e_b = V(M_1/L_1)\, y.$$

In accordance with what has been said at the time of the description of FIG. 1, the voltage $e_c$ must be equal to the voltage $e_a$ when $Z_a = Z_o$, that is to say when matching is achieved and $y = o$; the result is that the division ratio of the voltage reducer circuit 6 should be made equal to $M_1/L_1$ and that, accordingly, the voltage $e_c$ has the value: $e_c = V(M_1/L_1)$ and $e_a$ is the vector sum of the vector voltages $e_b$ and $e_c$.

The principle of adjusting of matching as a function of $e_a$, $e_b$ and $e_c$ is a conventional one. It consists on the one hand in varying the reactance of the matching circuit which is in series with the antenna A, as indicated at the time of the description of FIG. 2, so that the amplitude of $e_a$ is the same as that of $e_c$; it consists on the other hand in varying the reactance of the matching circuit which is in parallel with the antenna A, as also stated at the time of the description of FIG. 2, so that the phase difference between $e_a$ and $e_b$ is zero. Since these two adjustment operations interact, the signals produced by the voltage comparator and phase comparator circuits can only be brought to zero after several adjustments of the matching circuit reactances.

Self-evidently, other embodiments are possible, for example ones having recourse to other kinds of couplers or other kinds of matching circuits or again other methods of adjustment. For example, in the circuit of FIG. 3, adjustment can be performed by measurement of $e_b$ since a necessary and sufficient condition for the attainment of matching is that said value should be zero, although it turns out in practice that control is then quite a complex matter in particular when using automatic matching control.

What is claimed is:
1. A HF antenna matching device comprising: a directional coupler having first and second pairs of conjugate ports, said first pair having first and second ports, said second pair having a high-power port having a given coupling coefficient with said first port and a low-power port having a lower coupling coefficient with said first port, said first and second ports being adapted for respectively coupling to signal generating means and to measuring means during a matching phase a controllable matching circuit for being controlled as a function of the indications of said measuring means during a matching phase; a matched load; and a switching device for coupling the matching circuit to the high-power port and the matched load to the low-power port during a communication phase and vice versa during a matching phase.

2. A HF antenna matching device as claimed in claim 1, wherein said measuring means form part of the matching device and comprise a phase comparator circuit having two inputs respectively coupled to said second port and to said low-power port.

3. A HF antenna matching device as claimed in claim 2, wherein said control means also comprise: a voltage reducer circuit having an output and an input coupled to said signal generating means and whose reduction ratio is made equal to said lower coupling coefficient; and a voltage comparator circuit having two inputs respectively coupled to the output of said voltage reducer circuit and to said low-power port.

* * * * *